(12) United States Patent
Lafont et al.

(10) Patent No.: US 9,137,924 B2
(45) Date of Patent: Sep. 15, 2015

(54) VENTILATION-COOLED AVIONICS MODULE

(71) Applicant: Airbus Operations (SAS), Toulouse (FR)

(72) Inventors: Patrice Lafont, Mons (FR); Pierre-Louis Engelvin, Balma (FR)

(73) Assignee: Airbus Operations (SAS), Toulouse (FR)

( * ) Notice: Subject to any disclaimer, the term of this patent is extended or adjusted under 35 U.S.C. 154(b) by 290 days.

(21) Appl. No.: 13/845,497

(22) Filed: Mar. 18, 2013

(65) Prior Publication Data

US 2013/0294028 A1   Nov. 7, 2013

(30) Foreign Application Priority Data

Mar. 22, 2012   (FR) ...................................... 12 00863

(51) Int. Cl.
*H05K 7/20* (2006.01)

(52) U.S. Cl.
CPC ........ *H05K 7/20127* (2013.01); *H05K 7/20563* (2013.01)

(58) Field of Classification Search
CPC ... H05K 1/0201; H05K 7/20; H05K 7/20127; H05K 7/20563; H02B 1/56; B64D 47/00
USPC ................. 361/679.48–679.51, 688–723
See application file for complete search history.

(56) References Cited

U.S. PATENT DOCUMENTS

| | | | | |
|---|---|---|---|---|
| 4,829,402 A * | 5/1989 | Gewebler et al. | ............. | 361/692 |
| 6,381,147 B1 * | 4/2002 | Hayward et al. | ............. | 361/756 |
| 6,498,728 B1 * | 12/2002 | Sarno et al. | ................... | 361/752 |
| 6,912,131 B2 * | 6/2005 | Kabat | ........................... | 361/720 |

FOREIGN PATENT DOCUMENTS

EP   1075780   2/2001

OTHER PUBLICATIONS

French Search Report, Nov. 29, 2012.

\* cited by examiner

*Primary Examiner* — Anthony Haughton
*Assistant Examiner* — Yahya Ahmad
(74) *Attorney, Agent, or Firm* — Greer, Burns & Crain, Ltd.

(57) ABSTRACT

An avionics module including an electronic circuit board, a case in which the circuit board is positioned and including at least one inlet orifice and at least one outlet orifice for cooling air, a first corridor for the circulation of the cooling air formed between a first face of the circuit board and a first facing wall of the case, and a second corridor for the circulation of the cooling air formed between a second face of the circuit board and a second facing wall of the case. The module includes at least one baffle for controlling the distribution of the cooling air between the first and second corridors. Preferably, the baffle is fixed to the electronic circuit board.

8 Claims, 4 Drawing Sheets

VENTILATION-COOLED AVIONICS MODULE

CROSS-REFERENCES TO RELATED APPLICATIONS

This application claims the benefit of the French patent application No. 20120000863 filed on Mar. 22, 2012, the entire disclosures of which are incorporated herein by way of reference.

BACKGROUND OF THE INVENTION

The invention relates to the modular avionics equipment items embedded on aircraft such as, for example, airplanes, and more particularly the cooling of electronic circuit boards in such avionics equipment items.

In the field of embedded electronics, and in particular on aircraft, the modular electronics designs aim to reduce the maintenance costs and increase the availability of the applications. An avionics module is, within the terms of the following description, an electronics subassembly which, by virtue of a suitable mechanical interface and connection system, can be installed on the aircraft and be uninstalled individually therefrom according to the needs of maintenance, troubleshooting, upgrading, etc. of the embedded avionics.

It is a proven fact that the trend of the technologies in the electronics world has led to an increase in the power densities dissipated in the electronic components. This trend makes it necessary to ensure appropriate cooling of the electronic circuit boards in order to guarantee the operation of the electronic avionics functions.

An avionics equipment item can be made up of avionics modules each comprising a removable housing enclosing a certain number of electronic circuit boards that cannot be extracted in situ from the housing and that are not streamlined (equipment of ARINC 600 type). The housing is fixed on a main air stream for cooling the equipment item and the distribution of the air to the electronic circuit boards is performed globally inside the housing. The flow of air is thus diffused in the equipment, without differentiation onto the front face (so-called "TOP" face) and the rear face (so-called "BOTTOM" face) of the circuit boards that it contains. As a general rule, the heat-dissipating components are combined on one of the two faces of the electronic circuit boards, generally the front face. If there is not enough surface area on the front face, the rear face can be used for mounting certain components, whether heat-dissipating or not. Because of its global distribution, the cooling air flow is not therefore used optimally for the cooling of the circuit boards in the housing.

Now, because of increasing thermal powers to be dissipated on/in the electronics embedded in the aircraft, it is crucial to optimize the cooling of these electronics.

This problem arises also in the case where, instead of handling avionics modules each containing a number of electronic circuit boards, there is a tendency to handle the electronic circuit boards individually. With such an arrangement, each electronic circuit board is streamlined, which means that it is individually received in a case or sheath provided with an appropriate connection system to form an avionics module (also called "blade").

The avionics modules with individual electronic circuit board of this second type are received in groups in an avionics equipment item designed to allocate each avionics module a given air flow rate which is used to ventilate the electronic circuit board inside its case.

The invention aims to provide an avionics module of the abovementioned second type which makes it possible to optimize the cooling of the electronic circuit board positioned inside this module.

SUMMARY OF THE INVENTION

To this end, the subject of the invention is an avionics module comprising
an electronic circuit board comprising a first and a second face,
a case in which said electronic circuit board is positioned, the case comprising a first facing wall and a second facing wall and at least one inlet orifice and at least one outlet orifice for the passage of cooling air,
a first corridor for the circulation of cooling air, the first corridor being formed between the first face of the electronic circuit board and the first facing wall of the case, and
a second corridor for the circulation of cooling air, the second corridor being formed between the second face of the electronic circuit board and the second facing wall of the case,
wherein said avionics module comprises at least one baffle fixed to the electronic circuit board for controlling the distribution of cooling air between the first and the second corridors, and;
the electronic circuit board comprises at least one opening for the passage of cooling air and the baffle comprises an inclined wall for guiding cooling air toward said opening.

By virtue of this arrangement, the heat-dissipating components on both faces of the electronic circuit board, therefore in both of the cooling corridors, can be cooled optimally.

Moreover, the baffle or baffles can be chosen optimally according to the thermal characteristics of the circuit board, whereas the other elements of the avionics module remain standard and are unaffected by the thermal customization of the circuit boards.

Like the baffles, the characteristics of the openings for the passage of air can be chosen optimally according to the thermal characteristics sought for the circuit board which is equipped therewith, without affecting the other standard elements of the avionics module.

According to one possible feature of the invention, said baffle is positioned substantially in line with said air inlet orifice. In such a position, the baffle is interposed in the air stream which leads from the air inlet orifice and it can be very efficient.

According to another possible feature of the invention, said baffle is positioned in the vicinity of an edge of said electronic circuit board. This mounting of the baffle or baffles at the edge of the circuit board makes it possible to combine good ventilation efficiency with minimal encroachment on the surface of the circuit board receiving electronic and heat-dissipating components.

According to another possible feature of the invention, said first air inlet orifice opens into said first corridor and said baffle protrudes into said first corridor. By this arrangement, most of the air flow is directed into the first corridor. This makes it possible to ensure an optimal cooling of the electronic circuit boards in their case both in the cases where the heat-dissipating components are all positioned on the front face of the circuit board and are therefore cooled exclusively by the air flow which passes through the first corridor, and in those where one or more baffles distribute the air flow between the two corridors.

According to another possible feature of the invention, said first corridor has a section greater than that of said second corridor. This arrangement makes it possible to prioritize the cooling of the front face of the circuit board which in principle bears the heat-dissipating components, while providing the possibility of ensuring the cooling of heat-dissipating components mounted on the rear face of the circuit board.

According to another possible feature of the invention, said electronic circuit board is equipped with components of the surface-mounted component (SMC) type and said baffle forms part of said components. This mounting method makes it possible to not have to add any operations to the circuit board wiring procedure and to do away with the conventional fastening system (screw plus nut) which takes up space at the cost of space that is useful for the installation of the electronic components.

Another subject of the invention is an avionics equipment item comprising a subrack for receiving a plurality of avionics modules as defined above and means for the intake of cooling air under pressure into said modules.

Yet another subject of the invention is an aircraft comprising at least one avionics equipment item as defined above.

BRIEF DESCRIPTION OF THE DRAWINGS

Other features and advantages of the invention will emerge from the following description of an embodiment given solely as an example and illustrated by the appended drawings in which.

DETAILED DESCRIPTION OF THE PREFERRED EMBODIMENTS

Figure 1:
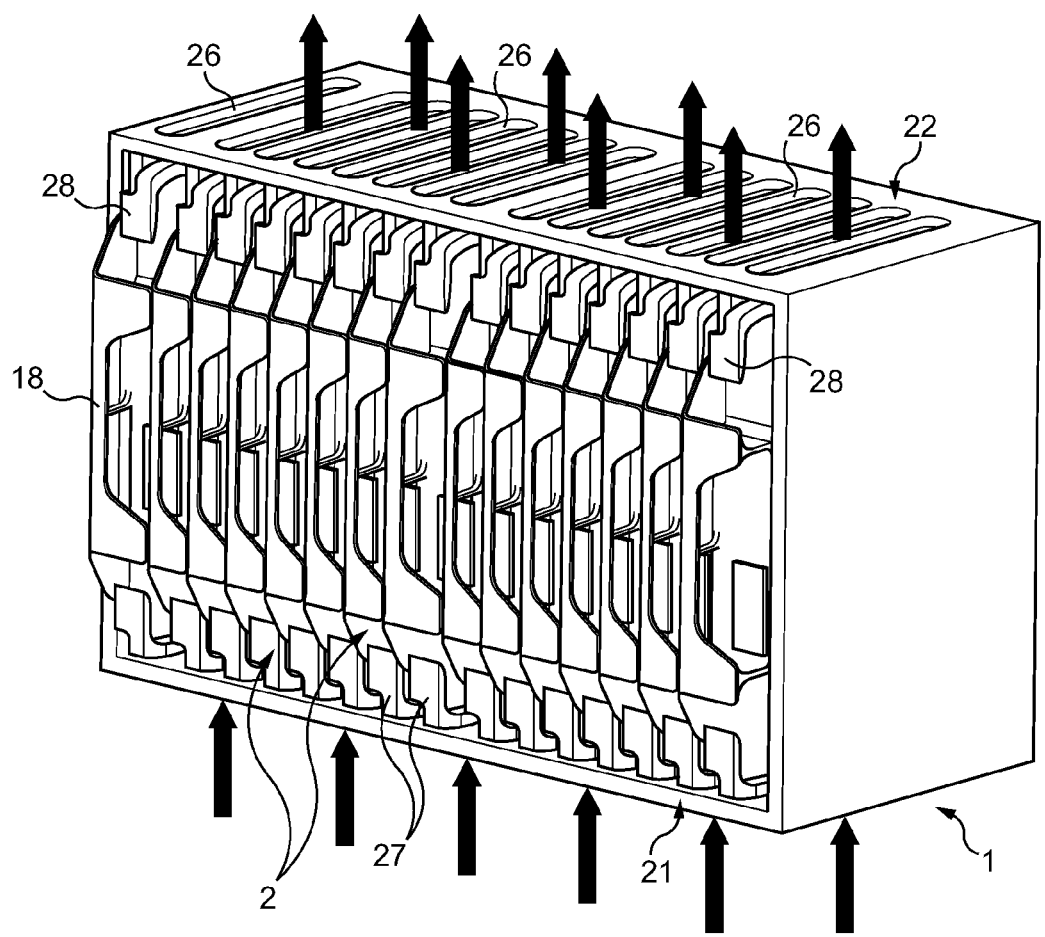
FIG. 1 is a perspective schematic view of an avionics equipment item equipped with avionics modules according to the invention.
Figure 2:
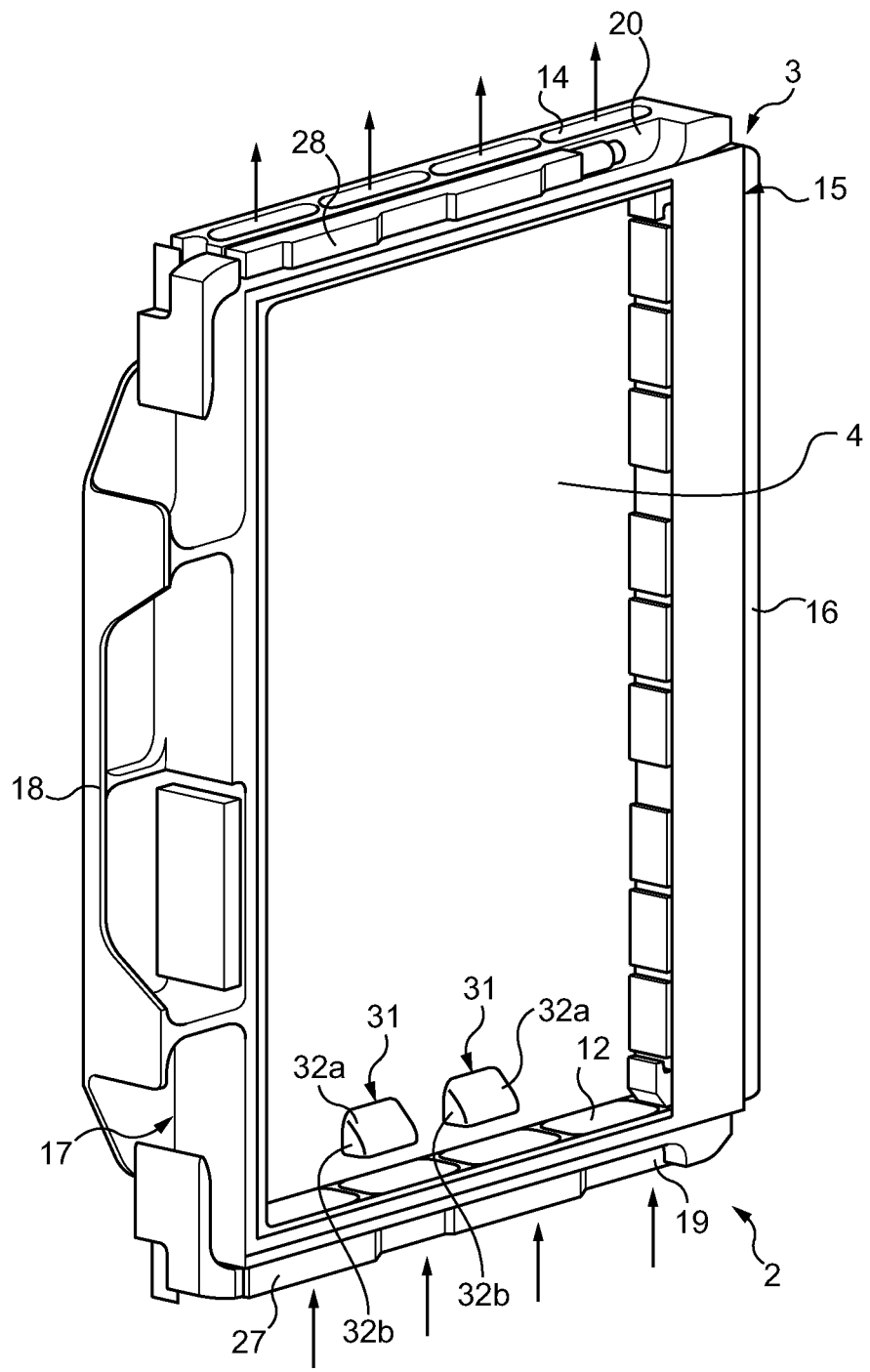
FIG. 2 is a perspective schematic view with partial separation of an avionics module with individual electronic circuit board.

Referring to the figures, an avionics equipment item intended to be mounted in or on an avionics console (not represented) of an aircraft (also not represented) comprises the subrack 1 in which a certain number of avionics modules 2 are mounted.

The avionics modules 2 each comprise a case 3 which is substantially of rectangular (or square) parallelepipedal form in which is mounted an electronic circuit board 4 also of substantially rectangular (or square) form.

The case 3 comprises a first wall 5 which delimits, with a facing front face 6 of the electronic circuit board 4, a first cooling corridor 7. The opposite wall 8 of the case 3 delimits, with the opposite rear face 9 of the electronic circuit board 4, a second cooling corridor 10.

The case 3 is relatively thin and its periphery comprises a bottom edge 11 provided with air inlet orifices 12, a top edge 13 provided with air outlet orifices 14, a rear edge 15 equipped with an electrical connector 16, and a front edge 17 provided with a gripping handle 18 which is used for handling the avionics module and for removing it and inserting it into the subrack 1.

The bottom edge 11 of the case 3 comprises a protruding rib 19 in which are formed the air inlet orifices 12 which open on the interior side of the case, into the first cooling corridor 7, and on the exterior side of the case, in a lateral face of the rib 19. Similarly, the top edge 13 of the case 3 comprises a protruding rib 20 in which are formed the air outlet orifices 14, which open in the interior of the case into the first cooling corridor 7. One or more air outlet orifices 14a are also formed in the top edge 13, on the side of the rib 20, to connect the second cooling corridor 10 with the exterior of the case 3.

The electronic circuit board 4 is preferably inset in a relatively air-tight manner over its entire periphery in the case 3. In the example illustrated by FIG. 3, in the interests of the simplicity of the drawing, heat-dissipating components 29 and 30 have been represented on only one of the three electronic circuit boards represented. As represented in this figure, the corridor 7 has a greater section than the corridor 10 because it is the front face 6 which receives most of the heat-dissipating components 29 and it is therefore that face which has to be most cooled.

The subrack 1 is of substantially parallelepipedal form and it is open on its front face to receive, by sliding, the avionics modules 2. The subrack 1 comprises a bottom rack 21 and a top rack 22.

The bottom rack 21 comprises a series of bottom compartments 23 parallel to one another whereas the top rack 22 comprises a series of top compartments 24 parallel to one another. The compartments 23 and 24 are open on the side of the open face of the subrack 1 through which the avionics modules can be installed in and removed from the subrack 1. There are equal numbers of compartments 23 and 24 and they have a substantially U-shaped transversal section, the openings of which face one another. Each pair of aligned compartments 23 and 24 defines a cell for housing an avionics module 2 in the subrack 1.

Each bottom compartment 23 has associated with it one or more air intake orifices 25 which pass through the bottom rack 21 and each open into an internal lateral face of this bottom compartment.

The compartments 24 of the top rack 22 each comprise, on the one hand, one or more air outlet orifices 23 in the wall forming the bottom of the U and, on the other hand, one or more channels 26a to allow for an evacuation of the air originating from the orifices 14a.

A rear panel (not represented) of the subrack 1 comprises a series of connectors (not represented) complimenting those 16 with which the avionics modules 2 are equipped on their rear face in order to connect these modules to the other avionics equipment items of the aircraft.

When mounting an avionics module 2 in a cell of the subrack 1, the compartments 23 and 24 are designed to receive respectively the bottom 19 and top 20 ribs of the avionics modules 2 in a substantially vertical position thereof. By virtue of the placement of a module 2 in the subrack 1, the orifices 12 of the rib 19 and 25 of the subrack 1 are made to substantially coincide.

A locking device then makes it possible to lock each circuit board or avionics module 2 in the top part and in the bottom part in the subrack 1.

Thus, for example, each avionics module 2 can be locked in the subrack 1 by virtue of locking rules 27 and 28. The rule 27 is received in a slideway delimited between the bottom of the U, the surface of the rib 19 which is opposite to that comprising the air inlet orifices 12, and the facing internal wall of the compartment 23. The rule 28 is received in a slideway delimited between the bottom of the U-section top compartment 24, a lateral face of the rib 20 and a facing internal wall of the compartment 24. The rules 27 and 28 may be shouldered rules force-fitted into the slideways or else locked in the grooves by expansion of a gripping mechanism.

The result thereof is a locking which ensures a good air-tightness between the avionics modules 2 and the subrack 1, which makes it possible to guarantee that the avionics modules are fed with cooling air with a given flow rate and at a given pressure.

The cooling air is directed via conventional means (not represented) to the air intake orifices 25 and, from there, individually to the avionics modules 2 via their respective air inlet orifices 12. The air naturally has a tendency to circulate in the first cooling corridor 7 of an avionics module 2 by virtue of the fact that the air inlet 12 and outlet 14 orifices of this module open into this corridor 7.

This is ideal for the cooling of the heat-dissipating components 29 positioned on a front face 6 of the electronic circuit board 4, but not for the cooling of heat-dissipating components 30 likely to be positioned on the rear face 9 of this circuit board, that is to say in the second corridor 10.

In order to allow for the cooling of these additional components 30, the electronic circuit board 4 is equipped with one or more baffles 31 positioned in the vicinity of the edge of this circuit board which is adjacent to the air inlet openings 12 of the module 2.

Each baffle 31 is wedge-shaped and comprises an air deflection wall 32a and two lateral air channeling walls 32b parallel to one another and with a V profile. The deflection wall 32a and the lateral walls 32b have edges which form a U in the plane of the face 6 of the circuit board 4. The deflection wall 32a can be planar or convex.

The baffle 31 is designed to be mounted on the electronic circuit board 4 with its deflection wall 32 oriented obliquely toward the air inlet orifice or orifices 12. The above mentioned U-shaped edges extend along three sides of an opening 33, for example rectangular or square, formed in the circuit board 4 to allow for the passage of air from the first corridor 7 to the second corridor 10.

Figure 3:
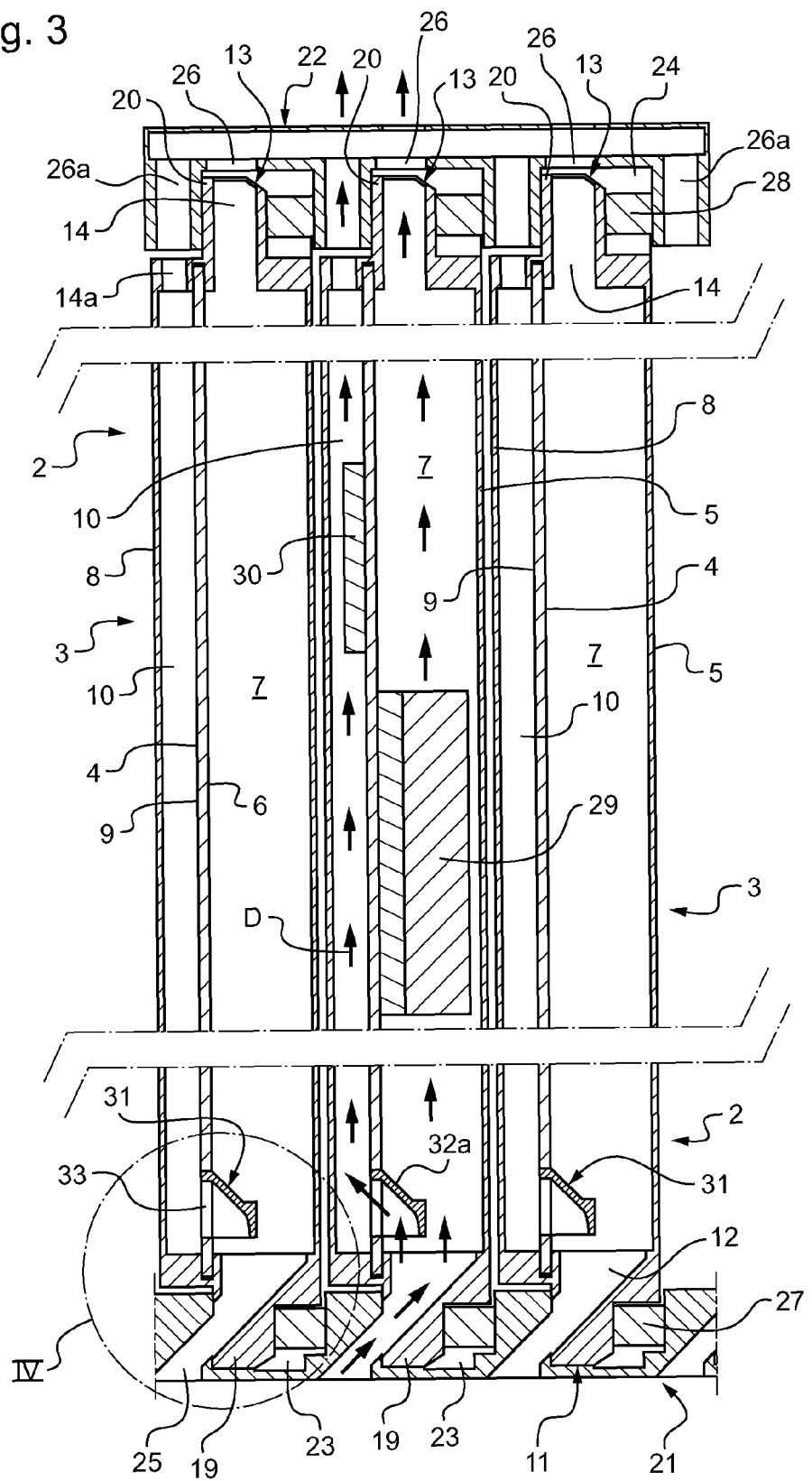
FIG. 3 is a partial schematic view in cross section of a subrack containing a number of avionics modules conforming to FIG. 2.
Figure 4:
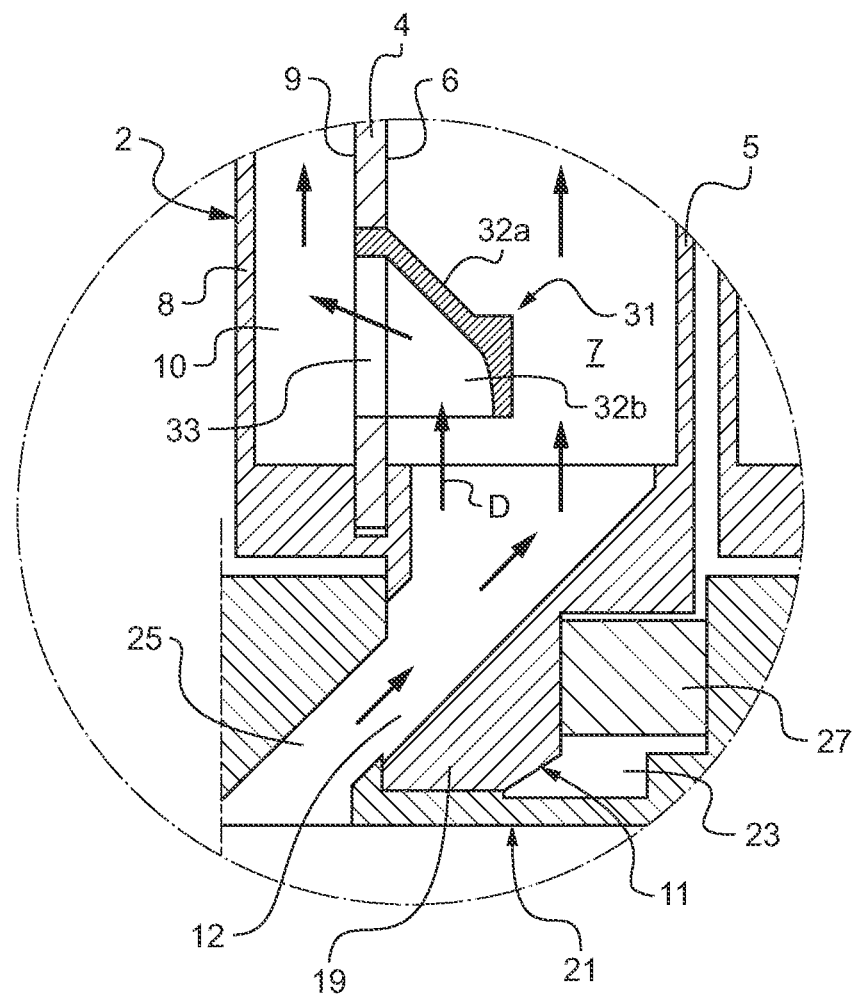
FIG. 4 is a partial schematic view in cross section showing an enlarged detail of the module of FIGS. 2 and 3.

When it is mounted on an electronic circuit board 4, the baffle 31 makes it possible to pick up, on the side of the front face 6, a part of the air flow originating from the air inlet orifice or orifices 12, in order to channel it through the opening 33 toward the rear face 9 of the circuit board as shown by the arrows D in FIGS. 3 and 4. The air circulating in the corridor 10 is evacuated upward from the module 2 via the orifice or orifices 14a of the module and the channel or channels 26a of the top rack 22.

The baffle 31 is preferably designed to the standard of the surface-mounted components (SMC) so as to be compatible with the industrial component positioning means. Its assembly can therefore be automated and performed during the component layout phase on the printed circuit of the electronic circuit board, and therefore with no impact on the industrialization of the product. The baffle 31 is preferably designed in such a way that the mechanical link thereof with the electronic circuit board is identical to that of the electronic components, namely by soldering on the printed circuit of the electronic circuit board.

Preferably, a range of baffles of different sizes is provided, the combination of which makes it possible, for each circuit board, to adjust the cooling air flow rate on the two faces thereof according to the heat-dissipating components with which this circuit board is equipped.

It is therefore on the electronic circuit board itself, according to the position and the thermal characteristics of the components that it bears, that, from its design, the problem of its cooling is resolved, by the management of the deflection of the cooling air flow. Thus, the dimensions, the number and the positions of the baffles 31 (and consequently also of the corresponding openings 33) are chosen and assigned on the circuit board during its design according to the positions and thermal characteristics of the heat-dissipating components.

Thus, in an avionics module 2, only the printed circuit board (PCB) of the electronic circuit board 4 is dedicated to the cooling function, the other elements of this module, and in particular the case 3, remaining standard and unmodified by the customization of the cooling of the electronic circuit board.

As is apparent from the foregoing specification, the invention is susceptible of being embodied with various alterations and modifications which may differ particularly from those that have been described in the preceding specification and description. It should be understood that I wish to embody within the scope of the patent warranted hereon all such modifications as reasonably and properly come within the scope of my contribution to the art.

The invention claimed is:

1. An avionics module comprising:
an electronic circuit board comprising a first and a second face,
a case in which said electronic circuit board is positioned, the case comprising a first facing wall and a second facing wall and at least one inlet orifice and at least one outlet orifice for the passage of cooling air,
a first corridor for the circulation of cooling air, the first corridor being formed between the first face of the electronic circuit board and the first facing wall of the case, and
a second corridor for the circulation of cooling air, the second corridor being formed between the second face of the electronic circuit board and the second facing wall of the case,
wherein said avionics module comprises at least one baffle fixed to the electronic circuit board within the first corridor for controlling the distribution of cooling air between the first and the second corridors, and;
the electronic circuit board comprises at least one opening for the passage of cooling air and the baffle comprises an inclined wall for guiding cooling air toward said opening and from the first corridor to the second corridor.

2. The module according to claim 1, wherein the at least one baffle is positioned substantially in line with the air inlet orifice.

3. The module according to claim 2, wherein the at least one baffle is positioned in the vicinity of an edge of said electronic circuit board.

4. The module according to claim 1, wherein the first air inlet orifice opens into the first corridor and the at least one baffle protrudes into the first corridor.

5. The module according to claim 4, wherein the first corridor has a section greater than that of said second corridor.

6. The module according to claim 1, wherein the electronic circuit board is equipped with components of the surface-mounted component type and the at least one baffle forms part of said components.

7. An avionics equipment item, comprising a subrack for receiving a plurality of avionics modules according to claim 1 and means for the intake of cooling air under pressure into said plurality of avionics modules.

8. An aircraft, comprising at least one avionics equipment item according to claim 7.

* * * * *